(12) United States Patent
Finteis

(10) Patent No.: US 6,898,747 B2
(45) Date of Patent: May 24, 2005

(54) METHOD FOR TESTING CIRCUIT UNITS TO BE TESTED WITH INCREASED DATA COMPRESSION FOR BURN-IN

(75) Inventor: Thomas Finteis, Munich (DE)

(73) Assignee: Infineon Technologies AG, München (DE)

( * ) Notice: Subject to any disclaimer, the term of this patent is extended or adjusted under 35 U.S.C. 154(b) by 406 days.

(21) Appl. No.: 10/232,070

(22) Filed: Aug. 30, 2002

(65) Prior Publication Data

US 2003/0042927 A1 Mar. 6, 2003

(30) Foreign Application Priority Data

Sep. 5, 2001 (DE) .......................................... 101 43 455

(51) Int. Cl.[7] .............................................. G11R 31/28
(52) U.S. Cl. ........................ 714/724; 714/733; 714/734
(58) Field of Search ................................ 714/724, 733, 714/734

(56) References Cited

U.S. PATENT DOCUMENTS 4,625,310 A * 11/1986 Mercer ........................ 714/724
5,594,694 A * 1/1997 Roohparvar et al. ........ 365/201

* cited by examiner

Primary Examiner—Phung My Chung
(74) Attorney, Agent, or Firm—Jenkins, Wilson & Taylor, P.A.

(57) ABSTRACT

The invention creates a method for testing circuit units (100) to be tested, in which test output signals (107a–107n) can be combined, where test input signals (106a–106n) are input from a test device (105) into the circuit unit (100) to be tested via a connecting unit (104), the circuit unit (100) to be tested is tested by means of the test input signals (106a–106n) in order to obtain corresponding test output signals (107a–107n) which indicate an operability of the circuit unit (100) to be tested, a gate unit (101) is connected to the connecting unit (104) by means of a first test mode switching unit (102) and of a second test mode switching unit (103), in such a manner that the test output signals (107a–107n), after being logically combined in the gate unit (101), are provided as a combined test output signal (109) via a single output line (110), and the combined test output signal (109) is output to the test device (105).

12 Claims, 2 Drawing Sheets

METHOD FOR TESTING CIRCUIT UNITS TO BE TESTED WITH INCREASED DATA COMPRESSION FOR BURN-IN

TECHNICAL FIELD

In general, the invention relates to a method for testing circuit units to be tested, in which test input signals are input into a circuit unit to be tested and subsequently test output signals output by the circuit unit to be tested are detected and analyzed and, in particular, relates to a method for testing circuit units to be tested in which test output signals are logically combined.

BACKGROUND ART

The present invention is based on the problem that circuit units, particularly memory chips with circuit units to be tested, must be subjected to extensive tests after production in order to meet the increasingly high quality requirements of the users. In this context, different test stages are distinguished where, beginning at a so-called front end, memory chips or circuits units to be tested are tested at a time when the wafer carrying the circuit units to be tested has not been sawn and the circuit units to be tested have not yet been packaged in a package.

This front-end test method has the advantage that specific positions on the circuit unit to be tested can be electrically contacted with pointed needles (contact needles) and voltages and currents can thus be detected precisely.

Disadvantageously, these contact points, also called test points, are no longer accessible from the outside when the circuit unit to be tested is packaged in a package.

During the further testing, a procedure called burn-in subsequently takes place, where the circuit unit to be tested is exposed, for example, but not exclusively to high temperatures and high voltages which results in artificial aging. It should be pointed out that during the aging of circuit units to be tested, a characteristic curve occurs when an error rate of the memory chips to be tested is plotted against time.

This characteristic curve is also called a bathtub curve, i.e. there is a high error rate at the beginning of the life of a memory chip to be tested whereas subsequently a low constant error rate is maintained over a relatively long time, which, finally, rises again. In order to reach a range of a long-lasting constant low error rate after a production of memory chips, the memory chips must be artificially aged and during this artificial aging, memory chips or circuit units which become faulty must be sorted out before delivery to the user.

In artificial aging or a burn-in process, a high voltage is conventionally achieved by actuation of a special test mode where internal voltage stabilizers are switched off and voltages are thus scaled with high operating voltages applied from the outside. During a burn-in procedure, a number of memory chips are generally contacted simultaneously via a socket connecting unit on a so-called burn-in board.

FIG. 3 shows a conventional memory chip with a circuit unit 100 to be tested which is connected to a test device 105 by means of a connecting unit 104. The circuit unit to be tested simultaneously supplies data on one or more test lines 111a–111n (typically, n=16 or n=32). It should be pointed out that the number n of test lines is not essential for understanding the invention.

If the circuit unit to be tested or the memory chip to be tested is to be tested in a conventional manner, a test line must be run to each connecting pin of the connecting unit 104 and the information provided thereon must then be checked for its correctness. This is done, for example, by means of a so-called comparator unit.

A simplification of conventional methods is obtained by the circuit unit to be tested internally comparing actual data with nominal data and signaling the result of this comparison at a single connecting pin of the connecting unit 104, in each case a number of bits being compared simultaneously and a result of this evaluation being logically combined.

This results in a data compression which advantageously saves a large number of comparator units and test lines. During this process, a number of data outputs, burst bits, addresses etc. can be compressed.

Referring to the so-called front end described above, a result achieved is not output at one but at a number of connecting pins of the connecting unit 104 which results in the advantage that an error in the circuit unit 100 to be tested can be located more accurately if, for example, different areas of the circuit unit to be tested output their test result at different connecting pins.

Such locating of errors is advantageously not required in a burn-in procedure since circuit units tested as faulty are generally sorted out during the artificial aging of the circuit units to be tested.

Disadvantageously, however, no further method of data compression is provided for a burn-in procedure or, respectively, no two different data compression methods are generally implemented, so that (chip) area is not unnecessarily used on the circuit unit to be tested. This has the disadvantageous result that data compression occurs at a number of connecting pins of the connecting unit 104 even in a burn-in procedure.

This results in the further disadvantage that a number of comparator lines must be run to each of the socket units on the burn-in board which either restricts the number of socket units or limits the width of conductor track.

SUMMARY OF THE INVENTION

It is thus an object of the present invention to run a single comparator conductor track to a socket unit in order to output test results of a burn-in procedure which is applied on circuit units to be tested.

According to the invention, this object is achieved by the method specified in claim 1 and by a device having the features of claim 4.

Further developments of the invention are obtained from the subclaims.

An essential concept of the invention consists in running a single comparator line or, respectively, a single output line to each circuit unit to be tested in order to obtain a test result in such a manner that a faultless state can be distinguished from a faulty state of a circuit unit to be tested which is subjected to a burn-in procedure.

In this arrangement, units existing on the memory chip to be tested such as, for example, logic gate units, are advantageously used for logically combining a test result provided on a number of connecting pins of the connecting unit.

The gate unit used is suitably activated only during the burn-in procedure. Since a test mode is activated for a burn-in procedure, the switching-on of the gate unit is advantageously combined with a switching-on of this test mode.

This makes it possible advantageously to simplify a design of burn-in boards which additionally considerably reduces a number of required comparator lines of the test device or output lines to the test device which provides an advantage of higher packing density of burn-in boards.

It is thus advantageous that an information item about a faulty or faultless state of a circuit unit to be tested can be read out by a single output line.

The method according to the invention for testing circuit units to be tested, in which test output signals are combined, essentially exhibits the following steps:

a) inputting test input signals from a test device into the circuit unit to be tested via a connecting unit;

b) testing the circuit unit to be tested by means of the test input signals in order to generate corresponding test output signals which indicate an operability, i.e. a faultless state or a faulty state of the circuit unit to be tested;

c) connecting a gate unit to the connecting unit by means of a first test mode switching unit and of a second test mode switching unit, in such a manner that the test output signals, after being logically combined in the gate unit, are provided as a combined test output signal via a single output line or, respectively, a single comparator line; and d) outputting the combined test output signal to the test device.

The subclaims contain advantageous developments and improvements of the respective subject matter of the invention.

According to a preferred development of the present invention, the test output signals are switched through the gate unit by means of the first test mode switching unit and the second test mode switching unit when a test mode is activated by the test device. A switching-on of the gate unit is thus combined in a simple manner with a switching-on of the test mode which must be activated in any case for a burn-in procedure.

This results not only in a simplification of a design of a burn-in board but the number of required comparator lines of the test device is considerably reduced.

According to a further preferred development of the present invention, the first test mode switching unit and the second test mode switching unit exhibit a combination of functions in such a manner that an alternate switching-through of a test line and of the totality of gate unit input lines is provided.

The device according to the invention for testing circuit units to be tested also exhibits the following:

a) a connecting unit for inputting test input signals from a test device into the circuit unit to be tested;

b) a gate unit for logically combining test output signals caused by the test input signals in the circuit unit to be tested;

c) a first test mode switching unit; and d) a second test mode switching unit which exhibits a combination of functions with the first test mode switching unit, the gate unit being connectable to the connecting unit by means of the first test mode switching unit and the second test mode switching unit, in such a manner that the test output signals, after being logically combined in the gate unit, are available as a combined test output signal via a single output line.

BRIEF DESCRIPTION OF THE DRAWINGS

Exemplary embodiments of the invention are explained in greater detail in the following description and are shown in the drawings, in which.

DETAILED DESCRIPTION OF THE INVENTION

In the figures, identical reference symbols designate identical or functionally identical components or steps.

Figure 1:
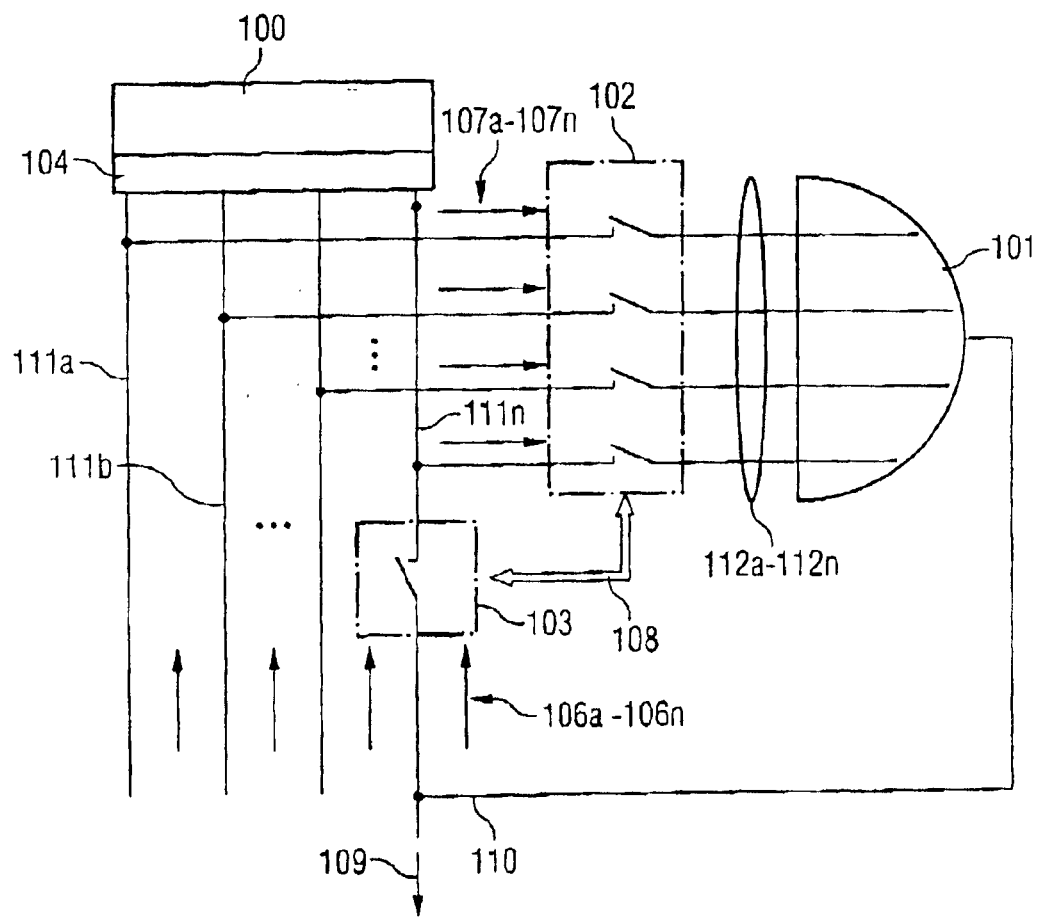
FIG. 1 shows a circuit arrangement for combining test output signals by means of a gate unit according to a preferred exemplary embodiment of the present invention.

In the circuit arrangement shown in FIG. 1, a circuit unit 100 to be tested is connected to test lines 111a–111n via a connecting unit 104. Test input signals 106a–106n can thus be supplied to the circuit unit 100 to be tested via the connecting unit 104 so that during an internal comparison of actual data with nominal data, test output signals 107a–107n are obtained which provide information about the operability of the circuit unit 100 to be tested.

Figure 2:
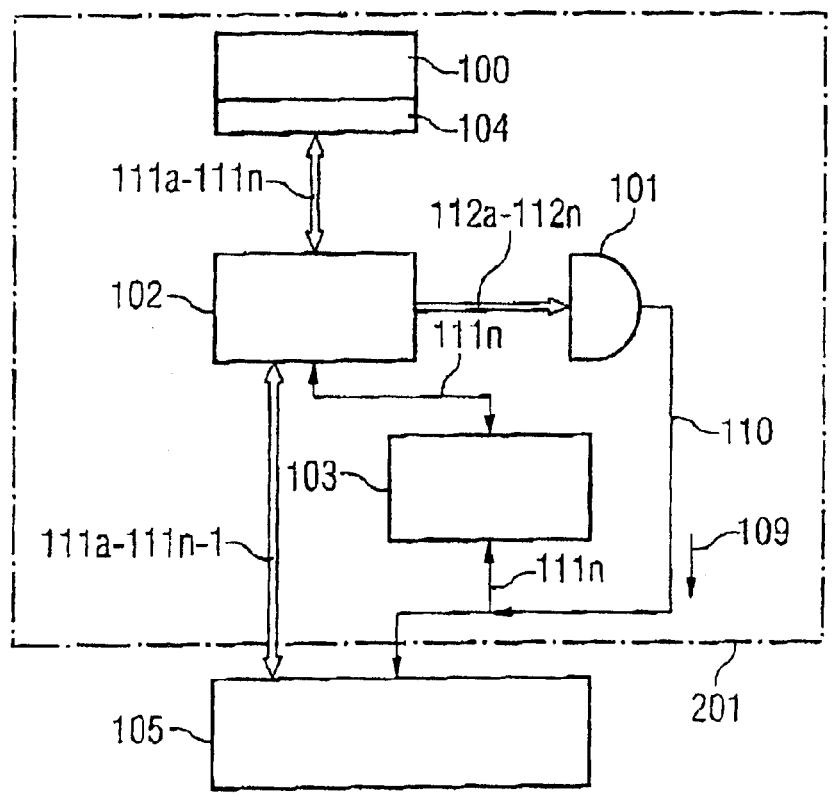
FIG. 2 shows a block diagram of the device according to the invention for testing circuit units to be tested.

Firstly, the principle of operation of the device to be tested will be explained by referring to the block diagram shown in FIG. 2. The circuit unit 100 to be tested is connected to a test device 105 via n test lines which, according to the invention, as shown in FIGS. 1 and 2, are specified as n-1 test lines 111a–111n-1 and a test line 111n.

When a test mode is activated, the test lines 111a–111n which connect the connecting unit 104 to a first test mode switching unit 102 are connected to the gate unit input lines 112a–112n by the first test mode switching unit 102.

It should be pointed out that a number of test lines 111a–111n corresponds to a number of gate unit input lines 112a–112n. A memory chip 201 contains the circuit unit 100 to be tested, the gate unit 101, the first test mode switching unit 102, a second test mode switching unit 103 and all line connections.

The first test mode switching unit 102 is functionally connected to the second test mode switching unit 103 by a logical combination of functions 108 (see FIG. 1), in such a manner that a line connection 111n is separated and used as an output line 110 of the gate unit 101.

The gate unit 101 can be constructed as an OR gate when the test output signals 107a–107n indicate by a logical zero a faultless state of the circuit unit 100 to be tested, and indicate by a logical one a faulty state of the circuit unit 100 to be tested.

Furthermore, the gate unit 101 can be constructed as an AND gate when the test output signals 107a–107n indicate with a logical one a faultless state of the circuit unit 100 to be tested and by a logical zero a faulty state of the circuit unit 100 to be tested. This analogously applies to all combinations of these logical combinations with one another and/or with negations, especially for the NOR and NAND gates, which are simple to produce technically.

In this manner, a combined test output signal 109, shown as a logical one when an OR gate is used or as a logical zero when an AND gate is used, is provided whenever a faulty state is detected in the circuit unit 100 to be tested so that a faulty tested circuit unit can be suitably sorted out.

The first and second test mode switching units 102 and 103, respectively, can be constructed with bipolar transistors or with field-effect transistors. The gate unit 101 can also be constructed with bipolar transistors and with field effect transistors.

The connecting unit 104 is advantageously constructed in such a manner that test input signals 106a–106n can be applied to all test lines 111a–111n, and that a combined test output signal 109 can be picked up via one of the test lines 111n.

Figure 3:
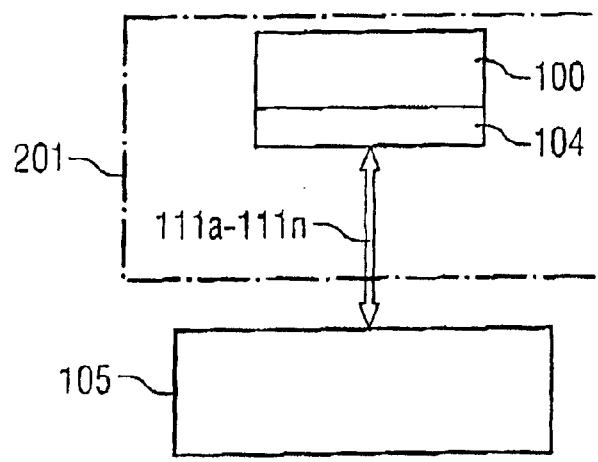
FIG. 3 shows a block diagram of a conventional circuit arrangement for testing circuit units to be tested.

With respect to the block diagram of a conventional circuit arrangement, shown in FIG. 3, reference is made to the introduction to the description.

Although the present invention has been described above by means of preferred exemplary embodiments, it is not restricted to these but can be modified in many ways.

LIST OF REFERENCE DESIGNATIONS

In the figures, identical reference symbols designate identical or functionally identical components or steps.
100 Circuit unit to be tested
101 Gate unit
102 First test mode switching unit
103 Second test mode switching unit
104 Connecting unit
105 Test device
106a–106n Test input signal
107a–107n Test output signal
108 Combination of functions
109 Combined test output signal
110 Output line
111a–111n Test line
112a–112n Gate unit input line
201, 201a Memory chip

What is claimed is:

1. A method for testing circuit unit to be tested, in which test output signals are combined, comprising the following steps:
  a) inputting test input signals from a test device into the circuit unit to be tested via a connecting unit;
  b) testing the circuit unit to be tested by means of the test input signals in order to generate corresponding test output signals which indicate an operability of the circuit unit to be tested;
  c) connecting a gate unit to the connecting unit by means of a first test mode switching unit and of a second test mode switching unit, in such a manner that the test output signals, after being logically combined in the gate unit, are provided as a combined test output signal via a single output line; and
  d) outputting the combined test output signal to the test device.

2. The method as claimed in claim 1, wherein the test output signals are switched through the gate unit by means of the first test mode switching unit and the second test mode switching unit when a test mode is activated by the test device.

3. The method as claimed in claim 1, wherein the first test mode switching unit and the second test mode switching unit exhibit a combination of functions in such a manner that an alternate switching-through of a test line and of gate unit input lines is provided.

4. A device for testing circuit unit to be tested, comprising:
  a) a connecting unit for inputting test input signals from a test device into the circuit unit to be tested;
  b) a gate unit for logically combining test output signals caused by the test input signals in the circuit unit to be tested;
  c) a first test mode switching unit; and
  d) a second test mode switching unit which exhibits a combination of functions with the first test mode switching unit, the gate unit being connectable to the connecting unit by means of the first test mode switching unit and the second test mode switching unit, in such a manner that the test output signals, after being logically combined in the gate unit, are available as a combined test output signal via a single output line.

5. The device as claimed in claim 4, wherein the gate unit is constructed as an OR gate when the test output signals indicate with a logical zero a faultless state and with a logical one a faulty state.

6. The device as claimed in claim 4, wherein the gate unit is constructed as an AND gate when the test output signals indicate with a logical one a faultless state and with a logical zero a faulty state.

7. The device as claimed in claim 4, wherein the gate unit is constructed with bipolar transistors.

8. The device as claimed in claim 4, wherein the gate unit is constructed with field-effect transistors.

9. The device as claimed in claim 4, wherein the first test mode switching unit and the second test mode switching unit are constructed with bipolar transistors.

10. The device as claimed in claim 4, wherein the first test mode switching unit and the second test mode switching unit are constructed with field-effect transistors.

11. The device as claimed in claim 4, wherein a number of test lines corresponds to a number of gate input lines.

12. The device as claimed in claim 4, wherein the connecting unit is constructed in such a manner that test input signals can be applied to all test lines and a combined test output signal can be picked up via one of the test lines.

* * * * *